(12) United States Patent
Tustaniwskyj et al.

(10) Patent No.: US 11,039,528 B2
(45) Date of Patent: Jun. 15, 2021

(54) ASSEMBLY AND SUB-ASSEMBLY FOR THERMAL CONTROL OF ELECTRONIC DEVICES

(71) Applicant: Delta Design, Inc., Poway, CA (US)

(72) Inventors: Jerry Ihor Tustaniwskyj, Mission Viejo, CA (US); Ernest Steve Blanco, San Diego, CA (US)

(73) Assignee: DELTA DESIGN, INC., Poway, CA (US)

( * ) Notice: Subject to any disclaimer, the term of this patent is extended or adjusted under 35 U.S.C. 154(b) by 24 days.

(21) Appl. No.: 16/505,695

(22) Filed: Jul. 8, 2019

(65) Prior Publication Data

US 2020/0060019 A1    Feb. 20, 2020

Related U.S. Application Data

(60) Provisional application No. 62/695,732, filed on Jul. 9, 2018.

(51) Int. Cl.
| | |
|---|---|
| *H05B 1/02* | (2006.01) |
| *H05K 1/02* | (2006.01) |
| *H01L 23/367* | (2006.01) |
| *H05B 3/20* | (2006.01) |
| *H05K 1/14* | (2006.01) |
| *H05K 1/18* | (2006.01) |
| *B82Y 30/00* | (2011.01) |

(52) U.S. Cl.
CPC ....... *H05K 1/0206* (2013.01); *H01L 23/3672* (2013.01); *H05B 3/20* (2013.01); *H05K 1/14* (2013.01); *H05K 1/18* (2013.01); *B82Y 30/00* (2013.01); *H05B 2203/002* (2013.01); *H05B 2203/017* (2013.01); *H05K 2201/066* (2013.01); *H05K 2201/10416* (2013.01)

(58) Field of Classification Search
CPC .......... H05K 1/0206; H05K 1/14; H05K 1/18; H05K 2201/066; H05K 2201/10416; H01L 23/3672; B82Y 30/00; H05B 2/20; H05B 2203/002; H05B 2203/017; H05B 1/02
USPC ............... 219/492, 497, 505, 121.43, 121.54
See application file for complete search history.

(56) References Cited

U.S. PATENT DOCUMENTS

| | | |
|---|---|---|
| 5,821,505 A | 10/1998 | Tustaniwskyj et al. |
| 5,844,208 A | 12/1998 | Tustaniwskyj et al. |
| (Continued) | | |

FOREIGN PATENT DOCUMENTS

EP    0 837 335 A1    4/1998

OTHER PUBLICATIONS

International Search Report and Written Opinion dated Nov. 6, 2019 in PCT/US2019/040899 (16 pgs.).

*Primary Examiner* — Mark H Paschall
(74) *Attorney, Agent, or Firm* — Foley & Lardner LLP (57) ABSTRACT

An assembly for controlling the temperature of a device includes: a heat sink configured to be maintained at a temperature below a desired set point temperature; a heater element having a surface configured to be thermally coupled to a surface of the device; and a thermally conductive pedestal interposed between the heat sink and the heater element. The heater is configured to apply heat to the device when the temperature of the device falls below the set point temperature, and heat is transferable to the heat sink through the pedestal and heater element when the temperature of the device is above the set point temperature.

18 Claims, 7 Drawing Sheets

(56) References Cited

U.S. PATENT DOCUMENTS

| | | | |
|---|---|---|---|
| 7,199,597 B2 | 4/2007 | Tustaniwskyj et al. | |
| 7,373,967 B1 | 5/2008 | Tustaniwskyj et al. | |
| 7,639,029 B2 * | 12/2009 | Wetzel | G01R 1/0458 |
| | | | 324/750.09 |
| 8,338,758 B2 * | 12/2012 | Kita | G01S 19/02 |
| | | | 219/490 |
| 8,547,122 B2 * | 10/2013 | Francisco | G01R 31/2875 |
| | | | 324/750.03 |
| 9,400,291 B2 * | 7/2016 | Johnson | G01R 31/2874 |
| 9,766,287 B2 * | 9/2017 | Narasaki | G01R 31/2874 |
| 2010/0163217 A1 | 7/2010 | Stuckey | |
| 2014/0139250 A1 * | 5/2014 | Yaglioglu | B82Y 30/00 |
| | | | 324/756.03 |
| 2015/0109009 A1 | 4/2015 | Barabi et al. | |
| 2015/0309112 A1 | 10/2015 | Goh | |
| 2018/0156863 A1 | 6/2018 | Song et al. | |

* cited by examiner

ASSEMBLY AND SUB-ASSEMBLY FOR THERMAL CONTROL OF ELECTRONIC DEVICES

TECHNICAL FIELD

The present disclosure relates generally to assemblies and sub-assemblies for controlling the temperature of a device, such as a semiconductor electronic device under test.

BACKGROUND

Systems for testing and handling electronic devices, such as packaged integrated circuit chips and unpackaged, bare "chips", conventionally may include a temperature control system to maintain the temperature of the electronic device near a constant set point temperature while the device is being tested. Any type of circuitry can be integrated into the chips, such as digital logic circuitry or memory circuitry or analog circuitry. Also, the circuitry in the chips can be comprised of any type of transistors, such as field effect transistors or bi-polar transistors.

It is desirable to keep the temperature of a chip constant while it is tested. For example, it is common to test various integrated circuits for failure at certain temperatures. Further, a common practice in the chip industry is to mass produce a particular type of chip, and then speed sort them and sell the faster operating chips at a higher price. CMOS memory chips and CMOS microprocessor chips are processed in this fashion. However, because the speed with which the chip operates may be temperature dependent, the temperature of each chip must be kept nearly constant while the speed test is performed in order to determine the speed of such chips properly.

Maintaining the chip temperature near a constant set point may be relatively simple if the instantaneous power dissipation of the chip is constant or varies in a small range while the speed test is being performed. However, if the instantaneous power dissipation of the chip varies up and down in a wide range while the speed test is being performed, then maintaining the chip temperature near a constant set point may be more difficult. Each time the device power dissipation makes a big change, its temperature and its speed will also make a big change.

The above problem has become particularly challenging as the density of transistors has increased in integrated circuits because their instantaneous power dissipation increases as the number of transistors switch ON or OFF. For example, during the speed test of a CMOS chip, the number of transistors which are switching is always changing; thus, the chip's power dissipation and temperature and speed are always changing. Also, the magnitude of these changes increases as more transistors get integrated into a single chip, because the number of transistors which are switching at any particular instant will vary from none to all of the transistors on the chip.

In addition to performance testing, it is desirable to utilize thermal control systems in other applications, such as "burn-in" testing, to quickly heat or cool an electronic component to a desired set point temperature.

SUMMARY

Embodiments described herein relate generally to an assembly and a sub-assembly for thermal control of an electronic component.

According to one aspect, a temperature control assembly includes a heat sink and a heater comprising a thermal conductive pedestal and a heater element. The heater is interposed between the heat sink and a device. In contrast with prior designs, the pedestal is interposed between the heat sink and the heater element. In operation, the heat sink has a temperature below a desired set point temperature for the device. The heater element is controlled to apply heat to the device when the temperature of the device falls below the set point temperature. When the temperature of the device is above the set point temperature, the heater element is controlled (e.g., turned off) to allow heat to be transferred from the device to the heat sink through the pedestal and heater element, thereby lowering the device temperature to the desired set point temperature.

According to certain embodiments, a thermally conductive interface material is disposed between the heat sink and the pedestal. The interface material may optionally comprise a carbon nanotube material or a thermally conductive epoxy.

According to certain embodiments, a thermally conductive interface material is disposed between the pedestal and the heater element. The interface material may optionally comprise a thermally conductive elastomeric material.

According to certain embodiments, the assembly is movable relative to the device, whereby the heater is moved to thermally couple with a surface of the device.

According to certain embodiments, a thermally conductive metallization layer is formed on the surface of the heater element and trimmed to contact particular portions of the surface of the device.

In certain embodiments, the pedestal and heater are constructed as a sub-assembly that is detachable from the heat sink, thereby permitting differently sized units to be attached to the heater for control of differently sized electronic devices. In some embodiments, the pedestal and heater sub-assembly is detachably coupled to the heat sink using a retainer member.

In certain embodiments, the sub-assembly can be mounted at different angular positions on a thermal head that includes the heat sink.

In certain embodiments, a thermal interface material is provided between the temperature control assembly and the device. The thermal interface material comprises a highly thermally conductive material, such as a thermally conductive liquid or a carbon nanotube material.

BRIEF DESCRIPTION OF DRAWINGS

The foregoing and other features of the present disclosure will become more fully apparent from the following description and appended claims taken in conjunction with the accompanying drawings. Understanding that these drawings depict only several implementations in accordance with the disclosure and are therefore not to be considered limiting of its scope, the disclosure will be described with additional specificity and detail through use of the accompanying drawings.

Reference is made to the accompanying drawings throughout the following detailed description. In the drawings, similar symbols typically identify similar components unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to systems and methods for thermal control of electronic devices. Embodiments may be advantageously used in testing and handling systems for semi-conductor materials.

U.S. Pat. Nos. 5,844,208 and 5,821,505 disclose a temperature control system in which an electric heater is interposed between a heat sink and a device under test (DUT), which may comprise, for example, a packaged semiconductor integrated circuit, a wafer, or a bare die. The disclosures of these patents are hereby incorporated by reference in their entirety. In the system disclosed in these patents, the heat sink is maintained at or near a constant temperature that is lower than a desired set point temperature of the DUT. The heater may be activated to raise the temperature of the DUT to the desired set point. When the temperature of the DUT increases from self-heating during testing, the heater may be turned off and heat is transferred from the DUT to the heat sink. The electric heater preferably comprises a thin resistive heater, which has a low thermal mass so as to improve the speed with which the heater can raise or lower its temperature and thereby maintain the temperature of the DUT near the set point. Also, the thermal resistance between the device and the heater is preferably made as small as possible in order to increase the amount of heat transferred from the heater to the electronic device relative to the amount of heat that is transferred from the heater to the heat sink. In order to lower this thermal resistance, these patents disclose the use of a thermal interface material (TIM), such as water or a mixture of water and a volatile material (e.g., ethylene glycol, methanol, ethanol) that may be applied between the DUT and the thermal control assembly.

Figure 1:
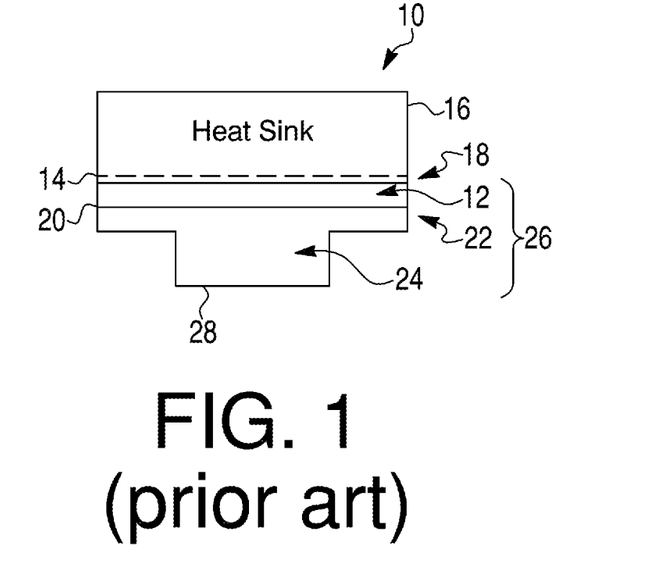
FIG. 1 is a schematic block diagram illustrating a thermal control assembly according to the prior art.

FIG. 1 generally illustrates a prior art embodiment of a thermal control assembly 10 in accordance with the systems disclosed in the '208 and '505 patents. In this example, the heater element 12 has a first upper face 16 that is thermally coupled to a heat sink 16 via a first thermal interface material (TIM) 18. A resistance temperature detector (RTD) (not shown) is incorporated with the heater element 12 to sense temperature. The heater element 12 has a second lower face 20 connected to a thermally conductive pedestal 24 via a second TIM 22. The pedestal and heater element together comprise a heater 26.

The pedestal 24 is configured to mount to the heater element and heat sink, and has a lower surface 28 dimensioned to contact an electronic component or DUT (not shown). Preferably, the pedestal 24 has a relatively high thermal conductivity to increase the amount of heat that can be transferred to and from the DUT to the heat sink. The use of the pedestal provides customized interface between a heat sink and differently sized-DUTs.

For example, as disclosed in U.S. Pat. No. 7,639,029 (the disclosure of which is hereby incorporated by reference in its entirety), an interposer element may be used to attach a pedestal to a thermal head (comprising the heater element and heat sink), which in turn is attached to a chuck or other mechanism that lowers and raises the thermal unit to contact a DUT while it is in a socket of a test device. The configuration of the pedestal, particularly the surface of the pedestal that contacts the DUT, can be changed to accommodate DUTs of different sizes and types so that differently sized DUTs can be used with a single type of thermal unit.

While embodiments of the thermal control system illustrated in FIG. 1 advantageously provide sufficiently fast response time in most cases and permit the use of a customized interface to match die dimensions, the inventor has discovered certain drawbacks associated with this design. For example, the extra thermal mass of the pedestal 24 disposed between the heater element 12 and the DUT may reduce responsiveness during test, which can affect DUT temperature during conditions of rapid heating. Further, the use of the configuration shown in FIG. 1 adds an additional interface between the DUT and the heater element 12, which generally requires calibration and reduces the maximum available offset of the control temperature, particularly where the temperature of the device is controlled based on power following or extrapolated temperature feedback instead of direct temperature feedback (based on directly sensing the temperature of the DUT).

Figure 2:
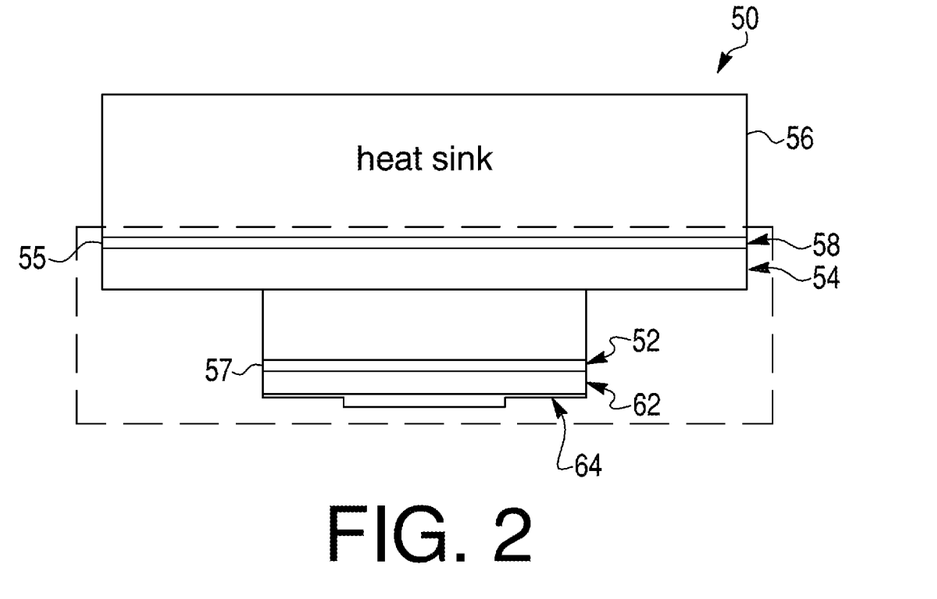
FIG. 2 is a schematic block diagram illustrating a thermal control assembly according to an exemplary embodiment.

FIG. 2 illustrates a thermal control assembly 50 in accordance with a first embodiment. In this example, a first side 55 of a pedestal 54 is attached to a heat sink 56. The heat sink 56 is configured to be set to a temperature lower than the desired set point temperature. Preferably, the heat sink 56 has a substantially larger thermal mass than the pedestal 54 and other elements of the assembly described below. In certain embodiments, the heat sink has a chamber through which liquid flows. In some embodiments, the liquid may flow through the chamber at a substantially constant flow rate. In other embodiments, the liquid may flow through the chamber at a variable rate to reduce electrical power usage in the heater as compared to a fixed rate, as described in U.S. Pat. No. 7,199,597 (the entire contents of which are hereby incorporated by reference).

The pedestal 54 may be configured to fit within a socket of a test device. Preferably, the pedestal 54 is formed of any high thermally conductive, and may comprise, for example, copper, aluminum, diamond or other materials. Optionally, a first thermal interface material 58 is provided between the heat sink 56 and the pedestal 54 to reduce the thermal resistance between those components. This material 58 may comprise, for example, a mechanical TIM, such as a thermal epoxy or carbon nanotube material with a high thermal conductivity. The opposing side 57 of the pedestal 54 is attached to a heater element 62, optionally via a second TIM 52. The second TIM 52 may comprise, for example, an elastomeric material with a high thermal conductivity. The heater element 62 may comprise an electrically resistive heater element integrated in a substrate made of aluminum nitride or other thermally conductive material. An RTD may be formed together with the heater element 62 to sense temperature.

Optionally, a metallization layer 64 is applied to the surface of the heater element 62 to form a contact surface that is configured to contact a DUT. The metallization layer 64 may comprise for example, a layer of nickel plated over the heater element. The metallization layer 64 contacts the surface of a DUT. The metallization 64 preferably is selected to avoid cracks or chipping when the thermal control assembly is applied to a device, such as a bare die. The dimensions of the metallization layer 64 also may be selected to correspond to the surface dimensions of the DUT, thereby permitting use of heater elements of a uniform size.

In certain embodiments, the surface of the heater element 62 may be metallized by, for example, co-firing tungsten (W) on aluminum nitride (AlN) or sputtering a metal onto AlN or other material, and then plating up nickel (Ni). For example a layer of Ni may be plated up to a thickness of about 200 μm and then machine-trimmed to match the particular surfaces of a DUT. For example, the metallization may be formed to contact the planar face of a device except for portions that are more susceptible to cracking (e.g., corners of the device).

Optionally, the pedestal and heater element may comprise part of a kit (represented in dashed lines) that may be adapted for use with particular electronic components, as discussed further below.

Optionally, an additional TIM (not shown) may be applied between the surface of the DUT and the thermal control assembly to further reduce thermal resistance between the DUT assembly. The thermal interface material comprises a highly thermally conductive material, such as a thermally conductive liquid or a carbon nanotube material.

Because there is no pedestal interposed between the heater element 62 and the DUT, it is not as critical that the pedestal have a low thermal mass as in the configuration of FIG. 1. The elimination of the pedestal in the thermal flow path between the heater element and the DUT significantly improves responsiveness.

Figure 3:
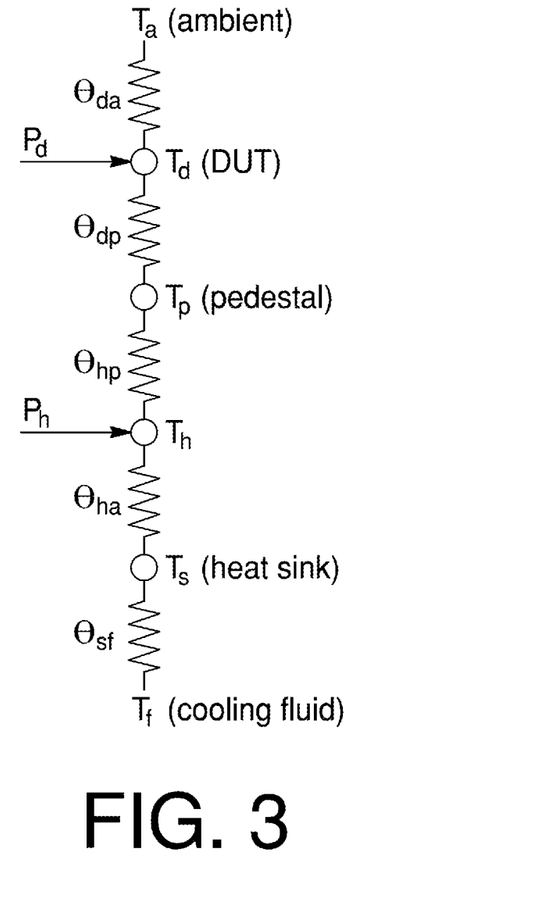
FIG. 3 is a diagram illustrating thermal characteristics of a prior art thermal control assembly.

FIG. 3 is a schematic of the control system according to the assembly of FIG. 1. In that system, power $P_d$ is applied during operation (e.g., testing) of a DUT. Power $P_h$ is also applied to a heater disposed between the DUT and a heat sink. In this example, a pedestal is disposed between the heater and the DUT. There is a thermal resistance $\theta_{da}$ between the ambient environment of the DUT (having an ambient temperature $T_a$) and the DUT. There is a thermal resistance $\theta_{dp}$ between the DUT and the pedestal, and a thermal resistance $\theta_{hp}$ between the pedestal and the heater. Additionally, there is a thermal resistance $\theta_{hs}$ between the heater and the heat sink and a thermal resistance $\theta_{sf}$ between the heat sink and cooling fluid running within the heat sink (which fluid has a temperature $T_f$).

Figure 4:
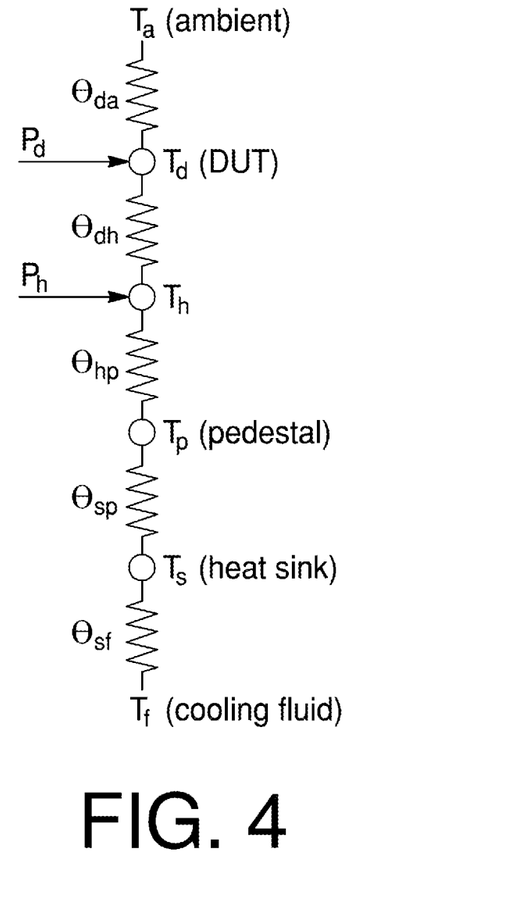
FIG. 4 is a diagram illustrating thermal characteristics of thermal control system according to FIG. 2.

FIG. 4 is a schematic of the control system according to the assembly of FIG. 2. In that system, there is no longer a thermal resistance $\theta_{hp}$ associated with the pedestal between the heater and the DUT as compared to FIG. 3. Additionally, the thermal mass of the pedestal is no longer between the heater and the DUT. Accordingly, the temperature fluctuations resulting from changes in DUT power are reduced because it is not necessary to transfer heat through the pedestal and its associated thermal resistance $\theta_{hp}$. This significantly improves the responsiveness of the assembly. Additionally, while reducing the thermal mass of the pedestal is critical in the assembly of FIGS. 1 and 3, the effect of the pedestal may be minimized by optimizing the thermal resistance $\theta_{hp}$ (in FIG. 4) between the pedestal and the heater. Specifically, if the thermal resistance $\theta_{hp}$ is made too small, then the heater is effectively coupled to the pedestal and the responsiveness of the DUT temperature to changes in heater power decreases. On the other hand, if the thermal resistance $\theta_{hp}$ is too large, it is difficult to transfer heat from the DUT to the heat sink. The thermal resistance $\theta_{hp}$ is primarily associated with the TIM disposed between the heater and the pedestal. Accordingly, the thermal resistance $\theta_{hp}$ may be easily controlled, for example, by selection of the specific TIM 52 between the heater element and the pedestal.

Preferably, in the assembly of FIGS. 2 and 4, the thermal resistance $\theta_{sp}$, which is associated with the TIM 58 between the pedestal 54 and the heat sink 56 is made as low as possible to optimize heat transfer from the DUT to the heat sink 56. The TIM 58 may comprise a highly thermally conductive elastomer, carbon nanotube material, or other materials.

Figure 5:
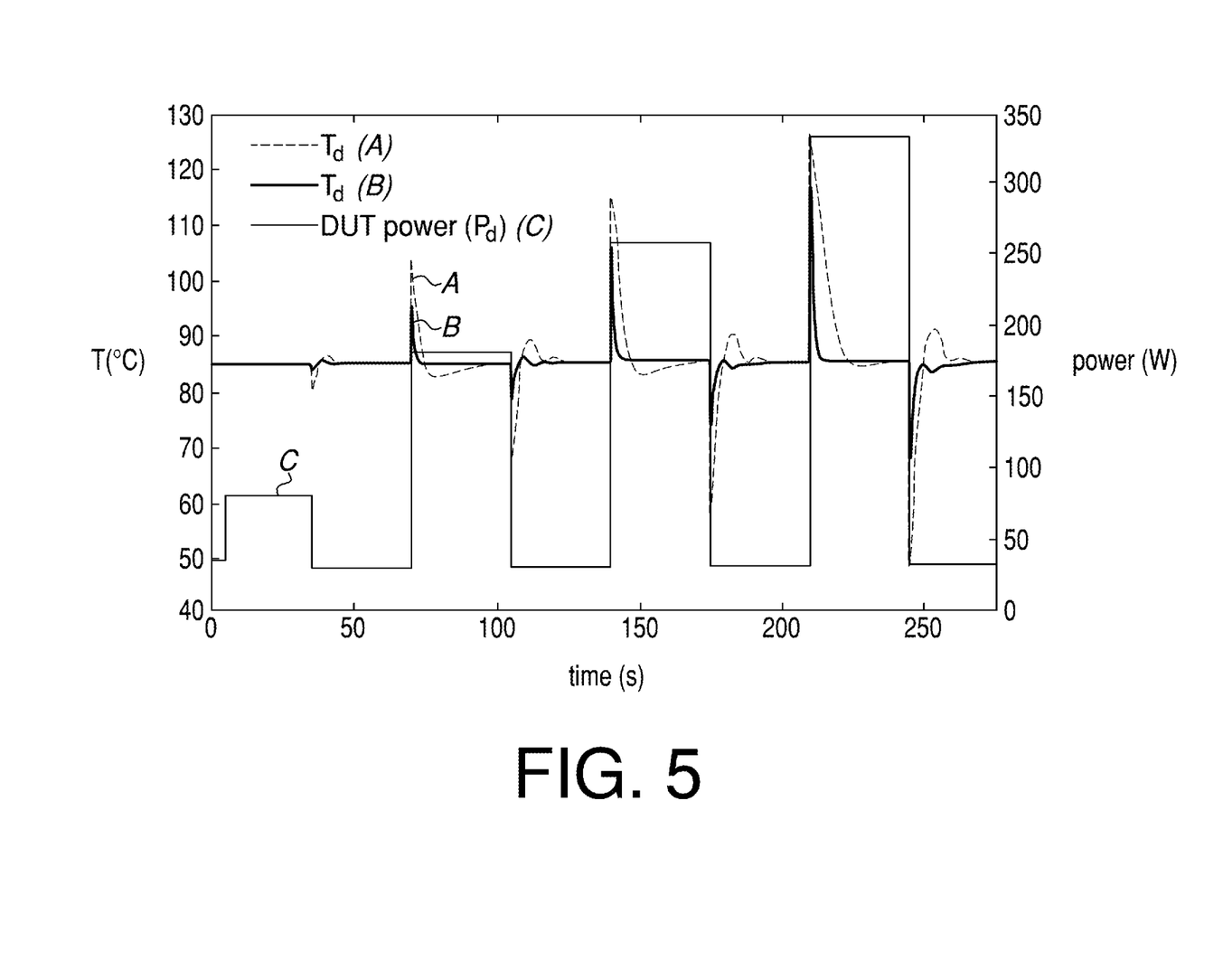
FIG. 5 is a chart comparing thermal responsiveness of a thermal control assembly according to an embodiment with that of a prior art thermal control assembly.

FIG. 5 is a graph showing the estimated improvement in responsiveness between the assembly of FIG. 1 and FIG. 2 generated using modelling data. In this example, the DUT power $P_d$ is shown as C. The temperature of the DUT Td using the assembly 10 of FIGS. 1 and 3 is shown as A and the temperature of the DUT Td using the assembly 50 of FIGS. 2 and 4 is shown as B. In this example, the desired set point temperature $T_{sp}$ of the DUT is 85° C. As shown by A, there is a significant "overshoot" of the desired set point temperature $T_{sp}$ at time 210 s using the thermal control system of FIGS. 1 and 3, as compared to the temperature of the DUT shown as B using the thermal control assembly 50 of FIGS. 2 and 4. Specifically, when power to the DUT is increased at time 210 s, the DUT temperature $T_d$ using the assembly 10 of FIGS. 1 and 3 reaches approximately 125 C. In contrast, the DUT temperature $T_d$ using the assembly 50 of FIGS. 2 and 4 reaches approximately 115 C, reflecting a 10 C improvement over the prior art assembly.

Further, the time for the DUT temperature to return to the set point temperature $T_{sp}$ is reduced by about 70% using the thermal control assembly 50 of FIGS. 2 and 4 as compared to the assembly 10 of FIGS. 1 and 3. Specifically, in the example of FIG. 5, the DUT temperature $T_d$ using the assembly 50 of FIGS. 2 and 4 returns to the set point by within less than 5 seconds, whereas the DUT temperature using the assembly 10 of FIGS. 1 and 3 takes about 15 seconds after application of power to the DUT.

FIG. 5 also illustrates an improvement in responsiveness when power is no longer applied to the DUT. Specifically, as illustrated in this example, the temperature of the DUT $T_d$ using the assembly 50 of FIGS. 2 and 4 only decreases to about 65° C. after power to the DUT $P_d$ is reduced at time 245 s, whereas the DUT temperature $T_d$ using the assembly 10 of FIGS. 1 and 3 drops to less than 50° C. Further, the DUT temperature $T_d$ using the assembly 50 of FIGS. 2 and 4 does not overshoot the set point temperature $T_{sp}$ as compared with the DUT temperature $T_d$ using the assembly 10 of FIGS. 1 and 3 (which has an increase to about 90° C. from about t=250 s to about t=260 s. It is noted that the responses illustrated in FIG. 5 are for 300 W DUT power steps.

Figure 6A:
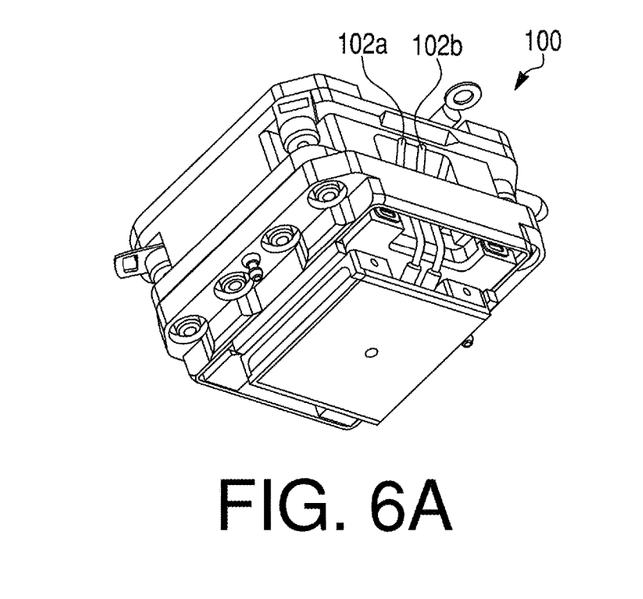
FIGS. 6A and 6B are perspective views of a thermal control assembly according to another aspect of the invention.
Figure 6B:
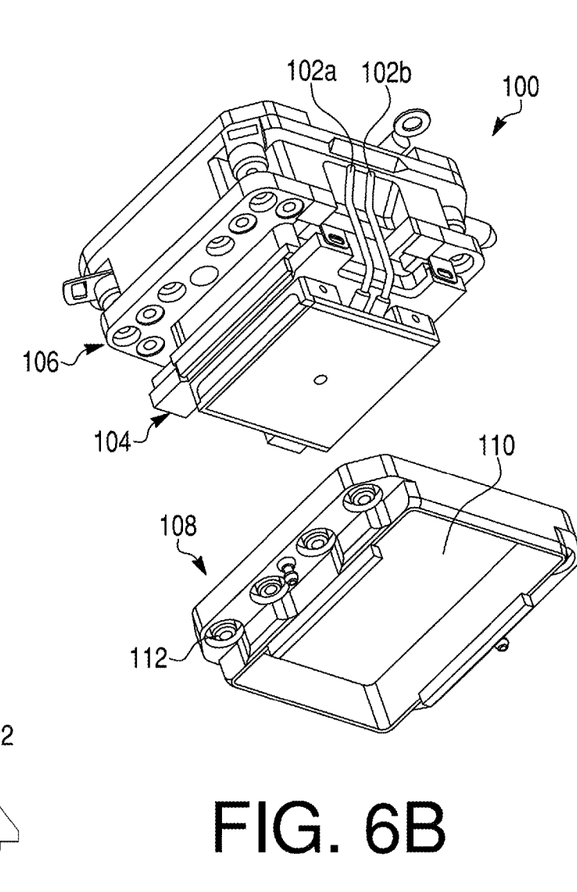

FIGS. 6A and 6B illustrates a thermal control assembly 100 in accordance with another embodiment. As shown, the bottom surface of the assembly comprises a metallization layer as described above formed over a heating element incorporated within a heater 104. The metallization layer is configured to contact a DUT (not shown), either directly or with an additionally thermal interface material selected to increase thermal conductivity between the assembly and the DUT. The heating element receives power through electrical connectors 102a and 102b. The heating element is attached to a pedestal, preferably via a TIM as described above (e.g., an elastomeric or semi-adhesive thermal conductive material) to form a detachable subassembly. The heater element and pedestal subassembly are removably attachable to a heat sink using a retainer member 108 having a recess 110 through which the heater surface extends so as to connect to a DUT.

Preferably, a second mechanical TIM material is provided between the subassembly (specifically the top surface of the pedestal) and the bottom surface of the heat sink. As noted above, this second TIM material may comprise a carbon nanotube material thermally or conductive epoxy. In this example, the retainer member 108 has openings 112 through which fasteners can be inserted to attach the pedestal. The retainer member 108 in this example is configured to avoid movement in the x-y direction (where x-y is a plane substantially parallel to the surface of a DUT) but permit some movement in the z direction (perpendicular to the surface of a DUT) so as to reduce the force applied to the surface of a DUT when the assembly is applied to contact a DUT.

In other embodiments, electrical connection to the heater element can be formed by clamps instead of wires as shown in FIGS. 6A and 6B.

Figure 7:
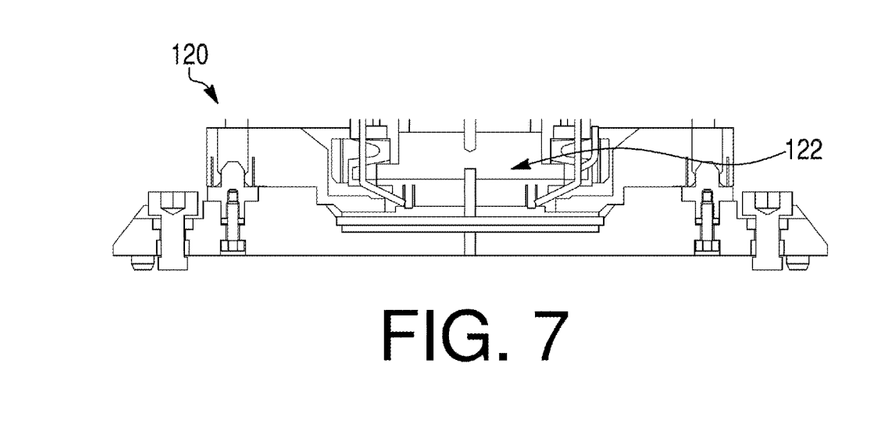
FIG. 7 is a side perspective view of a thermal control assembly configured to control the temperature of a device under test (DUT).

FIG. 7 is a side perspective illustrating a thermal control assembly 120, such as illustrated in FIGS. 2, 6A and 6B, which is applied to a DUT. The assembly 120 includes a thermal head 122 containing a heat sink to which is attached a subassembly that includes the heater element and pedestal. The bottom surface of the heater contacts a DUT. The entire assembly is movable in the z direction to be applied to a DUT in a test socket.

In addition to the improved thermal responsiveness noted above, embodiments of the invention may comprise a subassembly including a pedestal and a heater element, which can be readily attached to and removed from a thermal head containing a heat sink. This permits differently sized subassemblies to be used with the same thermal head. The sub-assemblies can be supplied as kits to be used with differently sized DUTs and test sockets.

In operation, a DUT is placed within a test socket that can apply power to the device according to techniques known in the art. A thermal control assembly, such as illustrated in FIG. 2 is moved in a z-direction to contact a surface of the device. The temperature of the device is determined or sensed according to techniques known in the art, such as those disclosed in U.S. Pat. No. 5,844,208. The heat sink within the assembly is maintained at a temperature below a set point temperature, for example, by flowing a liquid through the heat sink. When the temperature of the device is determined to fall below the set-point, power is applied to the heater to raise the temperature of the device to or substantially near the set-point temperature. When the temperature of the device is determined to exceed the set-point, power to the heater is reduced so as to permit heat to flow through the heater and pedestal to the heat sink until the device reaches or is near to the set-point temperature.

FIGS. 8A-8B, 9A-9B and 10 illustrate another embodiment of thermal control assembly 250, in which a heater assembly 276 that includes a pedestal and heater element are removably attachable to a thermal head 255. One feature of this embodiment, is that it allows the relative position of the heater assembly 276 as it is mounted to the thermal head 255 to be rotated. This feature provides additional flexibility in adjusting the position of the heater surface to facilitate thermal contact with differently sized DUTs.

Figure 8A:
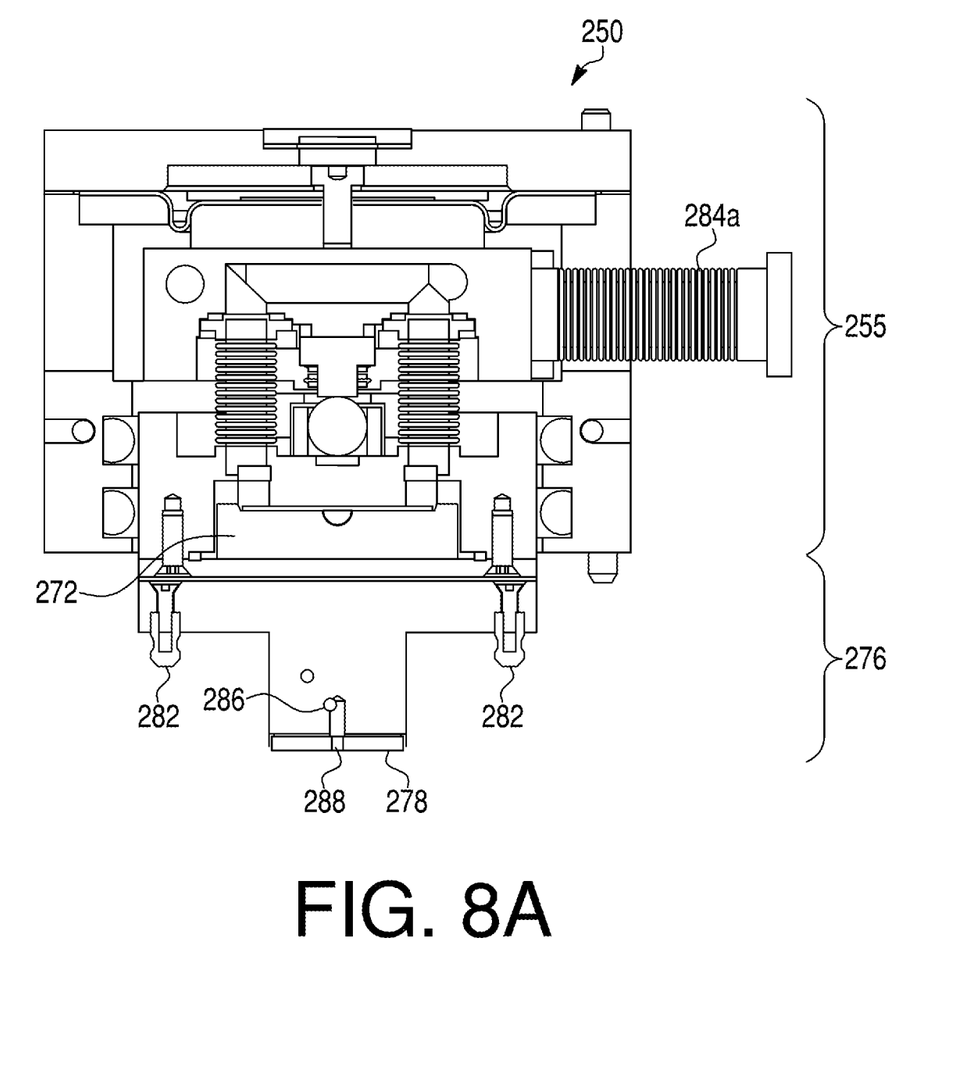
FIG. 8A is a side cross-sectional view of a thermal control assembly according to another embodiment.
Figure 8B:
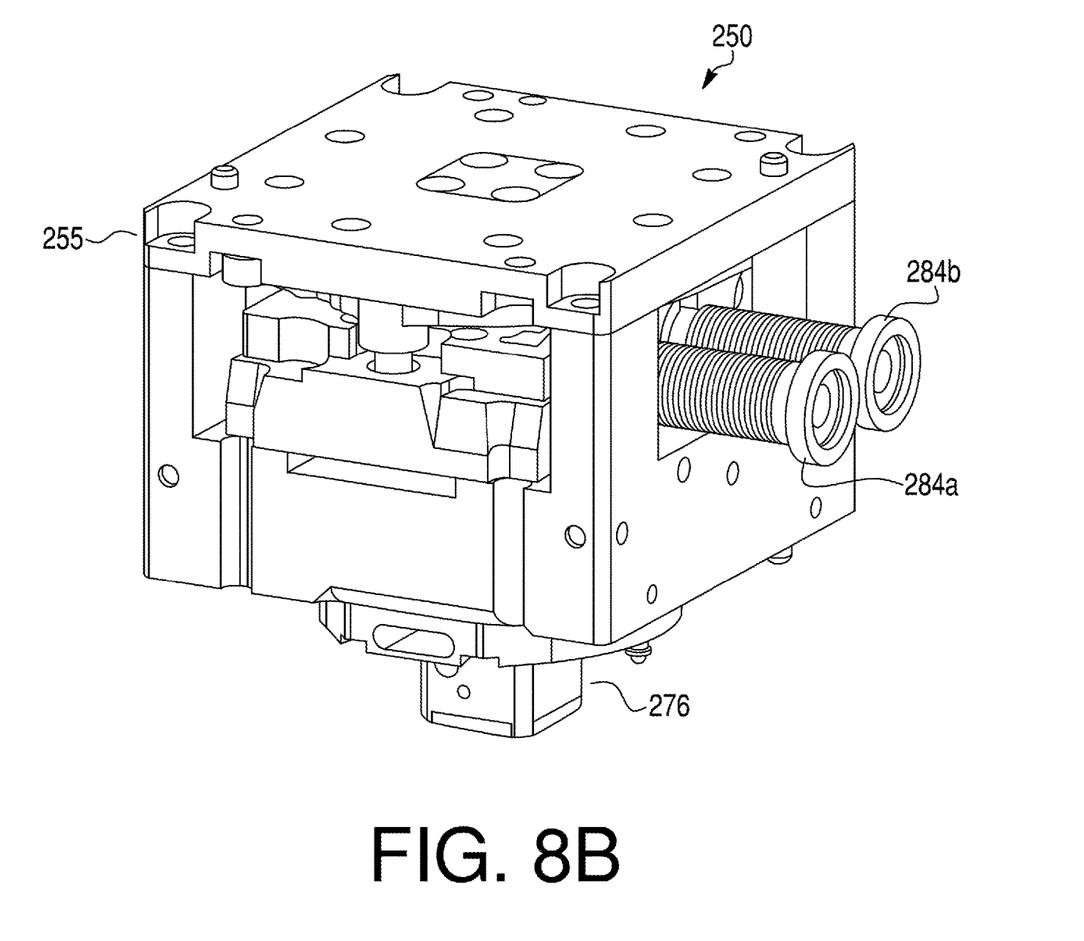
FIG. 8B is a perspective view of the thermal control assembly of FIG. 8A.

As shown in FIGS. 8A-8B, in this example, the thermal head 255 includes a heat sink 272. Fluid is circulated through the heat sink via fluid inlet 284a and fluid outlet 284b. The heater assembly 276 includes a lower surface 278 of a heating element which is configured to contact a DUT, either directly or through a metallization layer as discussed above, so as to establish a thermal path to transfer heat between a DUT and the heat sink 272.

In this particular example, the heater assembly 276 includes alignment pins 282, which align the assembly to a socket that holds a device (e.g., a DUT). The heater assembly 276 also includes a hole on the lower surface 278, which can provide a vacuum pick-up by applying suction through hole 286.

Figure 9A:
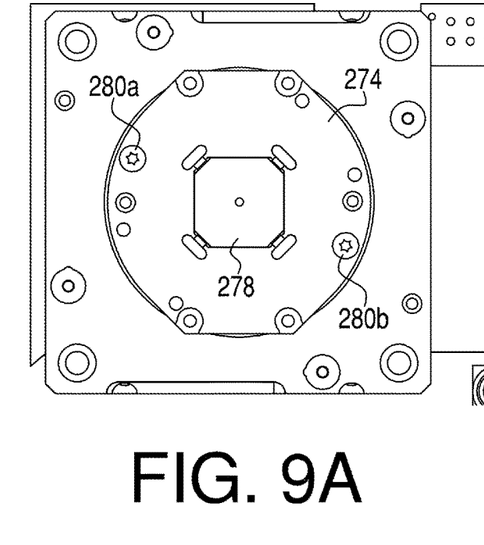
FIG. 9A is a bottom view of a heater assembly attached to a thermal head according the embodiment of FIGS. 8A-8B.
Figure 9B:
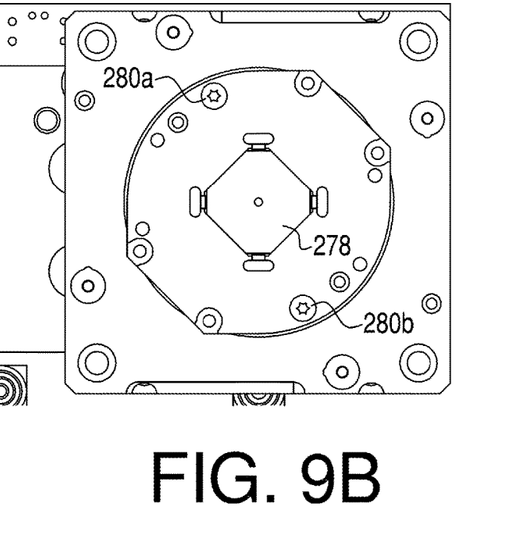
FIG. 9B is a bottom view showing the heater assembly of the embodiment of FIG. 8A rotated relative to the position shown in FIG. 9A.
Figure 10:
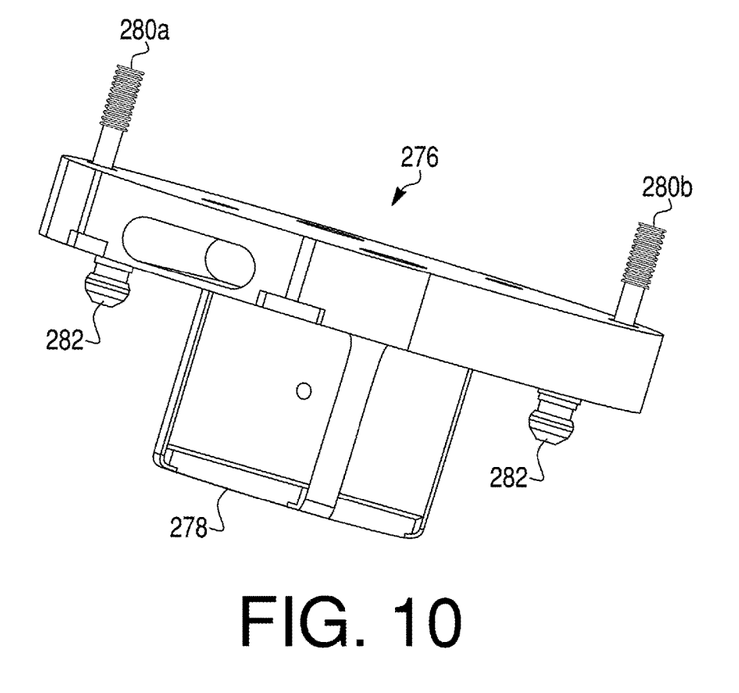
FIG. 10 is a side perspective view of a heater assembly according to the embodiment of FIG. 8A.

As illustrated in FIGS. 9A-9B and 10, the heater assembly 276 includes a mounting portion 290, which has holes through which a pair of mounting screws 280a and 280b can be inserted into pre-tapped holes in the thermal head 255. In this example, the mounting portion 290 forms a part of a pedestal on which the heating element is formed.

As shown in FIGS. 9A and 9B, the heater assembly 276 can be mounted at different angular positions on thermal head 255. For example, the heater assembly 276 as shown in FIG. 9A may be rotated 45° as shown in FIG. 9B. In this example, this is accomplished by providing at least two pairs of pre-tapped holes in the thermal head 255 (not shown) so that the angular position of the heater assembly 276 relative to thermal head 255 can be adjusted. In this way, the surface position of the heating element relative to a DUT may be readily adjusted to improve thermal transfer for different applications. While only two angular positions are shown in this example, it should be understood that additional positions may be provided, for example, by providing additional pre-tapped mounting holes on the corresponding surface of the thermal head.

As used herein, the terms "about" and "approximately," as applied to temperature values generally mean +/−10° C.

It should be noted that the term "example" as used herein to describe various embodiments is intended to indicate that such embodiments are possible examples, representations, and/or illustrations of possible embodiments (and such term is not intended to connote that such embodiments are necessarily extraordinary or superlative examples).

Although embodiments described above are particularly suited for thermal control of an electronic device under test, those of skill in the art that other embodiments may be adapted for thermal control of other devices in other applications.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements; values of parameters, mounting arrangements; use of materials, colors, orientations, etc.) without materially departing from the novel teachings and advantages of the subject matter described herein. Additionally, it should be understood that features from one embodiment disclosed herein may be combined with features of other embodiments disclosed herein as one of ordinary skill in the art would understand. Other substitutions, modifications, changes, and omissions may also be made in the design, operating conditions, and arrangement of the various exemplary embodiments without departing from the scope of the present application.

While this specification contains many specific implementation details, these should not be construed as limitations on the scope of any embodiments or of what may be claimed, but rather as descriptions of features specific to particular implementations of particular embodiments. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A thermal control assembly comprising:
a heat sink configured to be maintained at a temperature below a desired set point temperature;
a heater element having a surface configured to be thermally coupled to a surface of a device; and
a thermally conductive pedestal interposed between the heat sink and the heater element;
wherein the heater element is configured to apply heat to the device when the temperature of the device falls below the set point temperature, and heat is transferable to the heat sink through the pedestal and heater element when the temperature of the device is above the set point temperature.

2. The thermal control assembly of claim 1, further comprising a thermally conductive interface material disposed between the heat sink and the pedestal.

3. The thermal control assembly of claim 2, wherein the interface material comprises a carbon nanotube material.

4. The thermal control assembly of claim 2, wherein the interface material comprises a thermally conductive epoxy.

5. The thermal control assembly of claim 1, further comprising a thermally conductive interface material disposed between the pedestal and the heater element.

6. The thermal control assembly of claim 5, wherein the interface material comprises a thermally conductive elastomeric material.

7. The thermal control assembly of claim 1, wherein the thermal control assembly is movable relative to the device to thermally couple with a surface of the device.

8. The thermal control assembly of claim 1, further comprising a thermally conductive metallization layer formed on the surface of the heater element so as to contact a surface of the device.

9. The thermal control assembly of claim 1, wherein the heater element and pedestal form a sub-assembly that is detachable from the heat sink.

10. The thermal control assembly of claim 1, wherein the sub-assembly mounts to the heat sink at at least two angular orientations.

11. A thermal control sub-assembly comprising:
a heater element having a first surface and an opposing second surface, the second surface configured to be thermally coupled to a surface of a device;
a thermally conductive pedestal attached to the first surface so as to establish a thermal path to transfer heat from the device via the heater element to a heat sink,
wherein the heater is configured to apply heat to the device when the temperature of the device falls below a set point temperature, and heat is transferable to the heat sink through the pedestal and heater element when the temperature of the device is above the set point temperature.

12. The thermal control sub-assembly of claim 11, further comprising a thermally conductive interface material disposed between the heat sink and the pedestal.

13. The thermal control sub-assembly of claim 12, wherein the interface material comprises a carbon nanotube material.

14. The thermal control sub-assembly of claim 12, wherein the interface material comprises a thermally conductive epoxy.

15. The thermal control sub-assembly of claim 11, further comprising a thermally conductive interface material disposed between the pedestal and the heater element.

16. The thermal control sub-assembly of claim 15, wherein the interface material comprises a thermally conductive elastomeric material.

17. The thermal control sub-assembly of claim 11, further comprising a retaining member configured to attach the thermal control sub-assembly to a thermal head that includes the heat sink.

18. The thermal control sub-assembly of claim 11, further comprising a thermally conductive metallization layer formed on the surface of the heater element so as to contact a defined surface of the device.

* * * * *